United States Patent [19]

Vlach

[11] Patent Number: 4,985,860

[45] Date of Patent: Jan. 15, 1991

[54] MIXED-MODE-SIMULATOR INTERFACE

[76] Inventor: Martin Vlach, 6112 SW. Jan Tree Ct., Portland, Oreg. 97219

[21] Appl. No.: 369,358

[22] Filed: Jun. 21, 1989

[51] Int. Cl.$^5$ .............................................. G06J 1/00
[52] U.S. Cl. .................... 364/578; 364/200; 364/900; 364/221.2; 364/916.3
[58] Field of Search ............... 364/602, 607, 578, 188, 364/900, 569, 149, 221.2, 916.3, 240.8, 801; 434/433

[56] References Cited

U.S. PATENT DOCUMENTS 3,903,402  8/1985  Petit et al. ........................ 364/801
4,792,913  12/1988  Buckland et al. .................. 364/602

OTHER PUBLICATIONS

Arnout–*IEEE Journal of Solid-State Circuits,* vol. SC-13, No. 3, Jun. 1978, pp. 326–332.
Fine–*Electronic Engineering Times,* Monday, Feb. 8, 1988.
Corman–*Electronic Engineering Times,* Monday, Feb. 8, 1988.
Sampson–*VLSI Systems Design,* Nov. 1988, pp. 70–78.
Chadha–*Proceedings of the IEEE International Conference on Computer-Aided Design,* Nov. 7–10, 1988, pp. 258–261.
Menzel–ISCAS, Feb. 1989, pp. 1145–1148.

*Primary Examiner*—Parshotam S. Lall
*Attorney, Agent, or Firm*—Kolisch, Hartwell, Dickinson, McCormack & Heuser

[57] ABSTRACT

A mixed-mode-simulator interface synchronizes, at non-regular intervals, a system simulator which includes an analog realm and an event-driven realm, wherein both simulators perform a simulation on a single, mixed-mode system. The interface uses an error-driven procedure to time advance the analog realm, and uses events in the analog realm to time advance the event-driven realm. Polynomial interpolation rollback is used to adjust analog realm time location.

10 Claims, 6 Drawing Sheets

MIXED-MODE-SIMULATOR INTERFACE

BACKGROUND OF THE INVENTION

The invention relates to a mixed-mode-simulator interface for time-advance synchronizing a simulator having analog and digital portions thereto, and specifically to such an interface wherein the simulation in a digital realm is event-drive by that in the analog realm, and simulation in the analog realm is sensitive to changes in the event-driven realm.

A mixed mode simulator handles simulations which occur in what is generally referred to as analog and digital realms by solving mathematical models of real-world devices or elements. An analog simulator is described in my co-pending applications, Ser. No. 06/918,383, filed Oct. 14, 1986, for SYSTEM PERFORMANCE SIMULATOR, and a continuation of that case, Ser. No. 07/264,383, filed Oct. 31, 1988. Analog, or continuous, function elements are represented by mathematical models which consist of integrodifferential and/or algebraic equations which are continuous in time. Digital, or discreet, function elements are represented by mathematical models which consist of algebraic equations which are discontinuous in time.

The results of a simulation are waveforms, either continuous or discontinuous in value. The results of a simulation, however, can only be sampled by a simulator at specific points in time. The distance between these time points, called a time step, can be fixed (determined before the simulation by a parameter) or a variable (determined by an algorithm in the simulator). At each time step, either all outputs from the models, which simulate a real-world element, can be reported, or only those outputs which have a value changed from that of the previous time point may be reported.

Digital simulators are generally operated on a fixed-time step regimen, and therefore operate in discrete time blocks. The time step is referred to as time resolution and may be either predetermined by the simulator or assignable by the user. Regardless of how the time step is determined, time can be increased, during simulation, only in multiples of the time resolution.

The most basic digital simulator advances time by one step and evaluates outputs of all models based on their present and past inputs repeatedly until nothing changes, and then advances to the next time point. This approach is extremely inefficient and wastes time in evaluating models whose inputs have not changed.

In digital simulation, outputs of a model of a passive element can change only in response to a previous change of an input. Output of an active element, for example a stimulus or a clock, can occur spontaneously, but only at predetermined time points. It would be more efficient to consider only those models whose inputs have changed. In such an approach, many unnecessary evaluations are by-passed at each time point and, there may in fact be many time points when there are no changes.

A digital simulator may be constructed to be event-driven. As used herein, event-driven means that the simulation results in an output which has values which may be either continuous or discreet in nature. The event-driven simulation algorithm may be derived such that a queue of future events is maintained. The event queue also maintains output changes and the time at which they occur, and, after each evaluation, advances time to the next event, and evaluates only those models whose inputs have changed. The evaluation will allow the models in the simulator to enter or schedule events at some future time on a queue. This algorithm may be summarized as follows:

---

At time = 0, enter all spontaneous events into the queue
repeat {
Advance time to the time of the next event on the queue.
Assign the new output values that were saved on the queue.
For all elements whose input were changed in the previous step, evaluate the models.
}

---

An integration algorithm is used in an analog simulator to define an approximate solution to a mathematical problem or model, which may represent an analog, continuous function real-world element or device. Many different formulations may be employed, the most general being:

$$f(x,\dot{x},t)=0$$

Where x represents the unknowns, $\dot{x}$ represent the time derivatives of the unknowns, t is the time and f is the nonlinear relationship between the quantities.

As noted earlier, the solution is a waveform which is sampled at possibly irregular intervals. If a solution at previous time points, $t_{n-1}, t_{n-2} \ldots t_{n-k}$ is known, and is denoted by $x_{n-1}, x_{n-2} \ldots X_{n-k}$ and $\dot{x}_{n-1}, \dot{x}_{n-2} \ldots \dot{x}_{n-k}$, a time step h may be found to solve the algorithm for $x_n$ and $\dot{x}_n$ at a future time $t_n = t_{n-1} + h$.

A class of integration formula called Linear Multi-Step (LMS) formulas assumes that the solution x can be approximated in time by a polynomial. From this assumption, a relationship between the various quantities may be derived and represented by:

$$\sum_{i=0}^{k} \alpha_i x_{n-i} + \sum_{i=0}^{k} \beta_i h_i \dot{x}_{n-i} = 0$$

where $h_i$ equals $t_{n-1} - t_{n-i-1}$.

By carefully choosing coefficients $\alpha_i$ and $\beta_i$, various well known algorithms may be derived, such as the Euler Forward and Backward, Gear of Orders 1-6, and Trapezoidal. In any of these algorithms, a rearrangement of the above formula leads to an approximation of the derivative at time $t_n$, based on past values of x and $\dot{x}$ and possibly the new value $x_n$ where:

$$x_n = \sum_{i=1}^{k} \alpha'_i x_{n-i} + \sum_{i=0}^{k} \beta'_i h_i \dot{x}_{n-i}$$

This relationship, substituted into the original problem, leads to an algebraic equation in $x_n$:

$$g(x_n) = r(x_{n-i}, \dot{x}_{n-i}, t_n)$$

which may be solved by any number of numerical algorithms, such as the Newton-Raphson or the Katzenelson algorithms.

For practical implementations of the formulas, both of the order of integration (k) and the step size (h) may vary during simulation. For example, during startup, or initialization, first order integration has to be used, since no history is yet available. The accuracy of a solution depends on the size of the step. Generally, the shorter the step, the better the accuracy, however, additional work must be performed to solve the algorithms a greater number of times when using shorter time steps. In addition, the accuracy of a result at time $t_n$ may only be determined after $x_n$ is determined. If the achieved accuracy is not acceptable, the step must be discarded and a shorter step, i.e., smaller h, used. This experimentation is generally referred to as backtracking and is costly in processing time. The ideal algorithm would always guess just the right time step h to get the required accuracy, and would not select an h which was any smaller than that required to get the proper accuracy.

In known logic simulators, a variety of techniques are used to bring the simulated system up to a "steady" state condition. Some logic simulators begin at real-world system turnon. Others assume a steady state and require that the user initialize the system. Some analog simulators, such as Spice, perform an initialization at all times, regardless of whether it is really necessary to initialize the system or not. The interface of the invention allows the user to select, or allows the integration algorithms of the simulators to select, whether or not initialization is required before entering the transient phase of the simulation.

In mixed-mode simulation, both the event-driven and the integration algorithms must co-exist and cooperate. One way of achieving this is to have both algorithms work in the same simulation time, and let the time step be determined jointly by the two algorithms. This lock-step approach means that at each time step, determined by the event queue, the analog values $x_n$ are calculated, and also that the next time at which the integration algorithm is to be applied is entered into the event queue as an event. Threshold crossing times may be determined at the end of each time step and one of two procedures may be followed: (1) the threshold crossing may be deemed to have occurred at the end of the step, and is entered as an event into the queue at that time. This is potentially inaccurate, since in slowly varying systems, the analog time step may be much longer than any delay through the event-driven (digital) portion of the simulator; or (2) the time of the threshold crossing may be determined from $x_n$ and $x_{n-1}$ by interpolation and the analog simulator instructed to backtrack to that time in order to keep the two algorithms time synchronized. This is potentially costly in processor time.

A more efficient way to time synchronize analog and digital portions of a simulator is to allow events in the analog realm to drive events in the digital realm and to make events in the analog realm sensitive to changing events in the event-driven realm.

SUMMARY OF THE INVENTION

In the simulator interface of the invention, backing up in time is done by a time rollback which is accomplished by polynomial interpolation based on the integration algorithm. The threshold crossing time determination is done on the same interpolating polynomial as the time rollback and the integration algorithm step is considered as "peeking" at the future, while the event-driven simulation is always catching up to the next time point. Polynomials of the same order as the integration algorithm are used in this interface. Additionally, an initialization algorithm is included to provide simulation for a real-world system startup. The interface of the invention does not assume that all of the events are handled by a single simulator. Distributed event-driven simulations may be handled by the specific implementation of the event queue within the interface.

This approach guarantees that the analog and digital realm simulations proceed in unison. No backtracking is needed in the event-driven simulator and rollback in the analog simulator occurs only by reducing the last time step.

The integration algorithm may be described as follows:

---

Determine initial time step h.
Determine initial order of integration k.
Set $t_{now} = 0$.
repeat {
repeat {
Obtain the integration formula coefficients $\alpha_i'$ and $\beta_i'$.
Solve the system of nonlinear equations
$g(x_n) = r(x_{n-i}, x_{n-i}, t_n)$
If the reached accuracy is acceptable, break out of the inner loop.
Otherwise backtrack by choosing smaller h and repeating the inner loop.
}
Advance time: $t_{now} = t_{now} + h$
Choose the next step size h and integration order k, based on the previously reached accuracy and behavior of the solution and repeat the loop.
}

---

An object of the invention is to provide a mixed-mode simulator interface which allows selective synchronization of a simulator operating in an analog realm and a simulator operating in a digital realm.

Another object of the invention is to provide an interface which allows rollback along a continuous function in the analog realm in response to events which occur in a digital realm.

A further object of the invention is to provide an interface which allows events in an analog realm to drive events in a digital realm while making the analog simulator sensitive to events in the digital realm.

Another object of the invention is to provide an interface which provides an initialization mechanism for simulating real-world system startup.

The interface of the invention is intended to synchronize, at non-regular intervals, a system simulator which includes an analog realm and an event-driven realm, wherein both simulators perform a simulation on a single, mixed-mode system. The interface includes analog-time-advance mechanism for advancing analog simulation time by a predetermined time amount, h, integration mechanism for predicting analog values and analog-error analysis mechanism for determining an acceptable analog error and for selecting the predetermined time amount. An analog-function-threshold-crossing sensor is provided for detecting, from a threshold-crossing value, a threshold crossing of a continuous function and a crossing time therefore. An event queue receives the crossing time and events times and values from the event-driven simulator and determines a next-event time. An evaluation mechanism is provided for evaluating only those event-driven elements whose value changed since the last event. A synchronizer determines the continuous function values at a future time, which is prior to the end of the predetermined time amount, h.

These and other objects and advantages of the invention will become more fully apparent as the description which follows is read in conjunction with the drawings.

DETAILED DESCRIPTION OF THE PREFERRED EMBODIMENT

It should be appreciated that, although the invention is described in terms of a simulator operating in an analog realm and a simulator operating in an event-driven realm, a single simulator, with analog and event-driven portions is what is being described. In normal operations, the two portions of the simulator utilize models of real-world elements to produce a simulation thereof. Other arrangements of analog and event-driven, or digital, simulators may be used with the interface of the invention.

As the simulation progresses, it is frequently the case that events in one realm affect events in the other realm and that, periodically, the two portions of the simulator must consider events which have taken place in the other realm. In the conventional lock-step simulator, an event in one realm which affects events in the other realm would cause the affected simulator to discard all of its calculations and essentially start over again. As has been previously noted, this is a very inefficient system.

Figure 1:
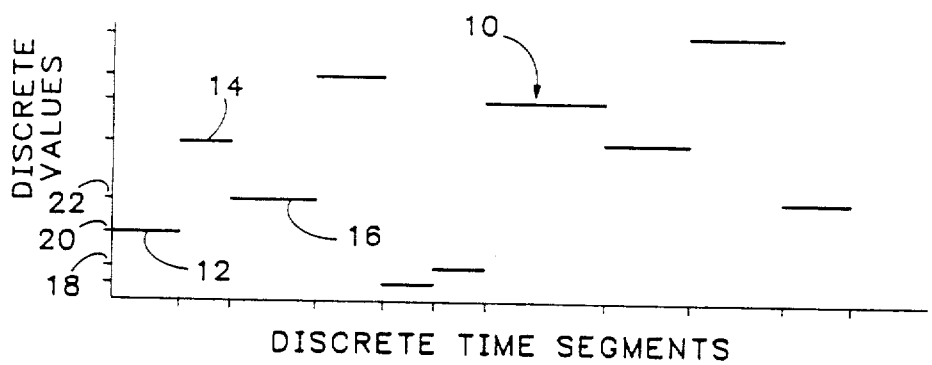
FIG. 1 represents the manner in which a prior art digital simulator would depict simulated events.

Referring now to the drawings, and initially to FIG. 1, representative output of a prior art digital simulator is depicted generally at 10. Output 10 consists of output segments, such as 12, 14, 16, etc., each of which has a discrete value over a discrete time segment. The discrete values and the discrete time segments are not required to be of equal intervals or length, but are predetermined by either the user or the simulator itself. In fact, the real-world element represented by output segment 12 may have a value lying somewhere other than that lying precisely on value 20 as depicted, and required by the digital simulator.

Figure 2:
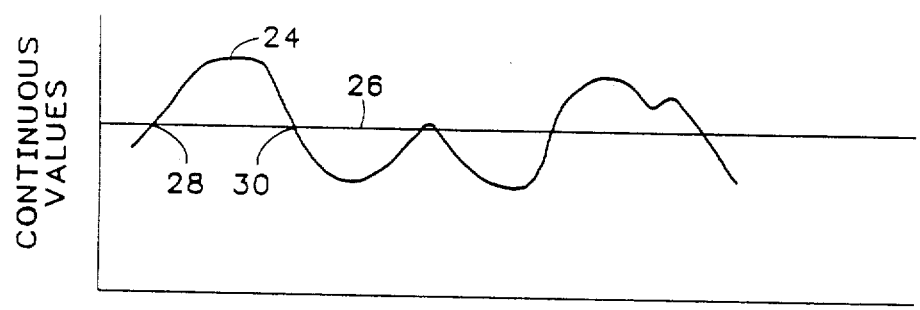
FIG. 2 is a representation of an analog simulation constructed according to the invention.

FIG. 2 depicts the output 24 of a continuous function analog-type simulation, which is the output of an analog realm of a mixed-mode simulator. A threshold crossing value 26 is predetermined, either by the user or by the models. A number of events occur in the analog realm. One of the events is a threshold crossing, such as is represented at 28 and 30. It should be noted that both value and time increments are continuous, i.e., are broken up into a potentially infinite number of intervals.

Figure 3:
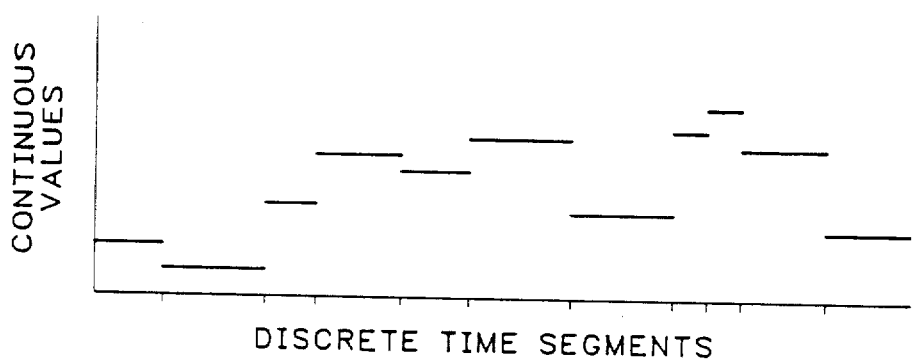
FIG. 3 is a representation of output from an event-driven simulation constructed according to the invention.

Referring now to FIG. 3, output from the event-driven simulator portion of the invention is depicted generally at 28. Output 28 differs from output 10 in that, while the time segments in which the output is reported are still discrete, the values which may be taken by the output segments are continuous.

In the interface of the invention, whenever an input to an analog model changes discontinuously, the integration algorithm must be restarted at that point, forcing an evaluation of x at that time. For independent sources, these times are known and the integration algorithm can arrive at that time exactly without backtracking. In mixed-mode simulation, however, such a time may not be known until after the next time step is taken, and, in a conventional mixed-mode simulator, a backtrack may be required. In the conventional simulator, backtrack requires discarding the current result $x_n$ and re-evaluating a new $x_n$ using a shorter time step. In the interface of the invention, time rollback is done by polynomial interpolation instead of being done by conventional backtrack techniques.

The integration algorithm assumes that the waveforms are approximated by polynomials on the interval from $t_{n-k}$ to $t_n$. It is on this approximation to the real waveform that the interpolation is performed. Although actual waveform from $t_{n-1}$ to $t_n$ can only be attained by a re-evaluation, the LMS formulas guarantee that an acceptable approximation at any point in the interval may be obtained from the interpolating polynomial, provided the polynomial is of the same order as the integration algorithm on the points $x_n, x_{n-1} \ldots x_{n-k}$. Compared to conventional simulators, the effort to obtain the polynomial's value at a point $t_b$ inside the interval $t_{n-1}, t_n$ is negligible compared to re-evaluating the integration formula with a backtrack. Any threshold crossings prior to and at $t_b$ are considered to have been properly determined.

A threshold crossing constitutes the underlying mechanism triggering communication and synchronization between the analog realm and the event-driven realm. Rollback, however, is not automatically forced by a threshold crossing, since the analog models do not necessarily change just by crossing a threshold. The exact time of a threshold crossing is obtained from considering the same interpolation polynomial as in the rollback. In this way, should a threshold crossing force an immediate change in the analog model via the event propagating without delay through the event-driven realm, the resulting rollback point $x_b$ at $t_b$ is exactly at the threshold value.

Figure 4:
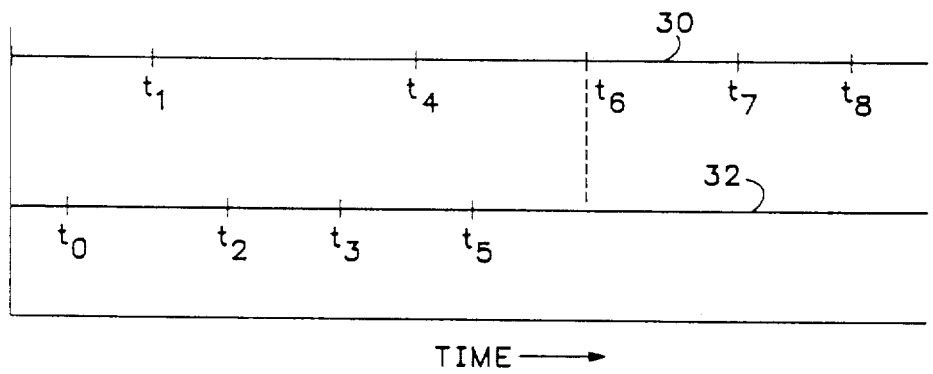
FIG. 4 depicts time advanced synchronization as such occurs in the interface of the invention.
Figure 4A:
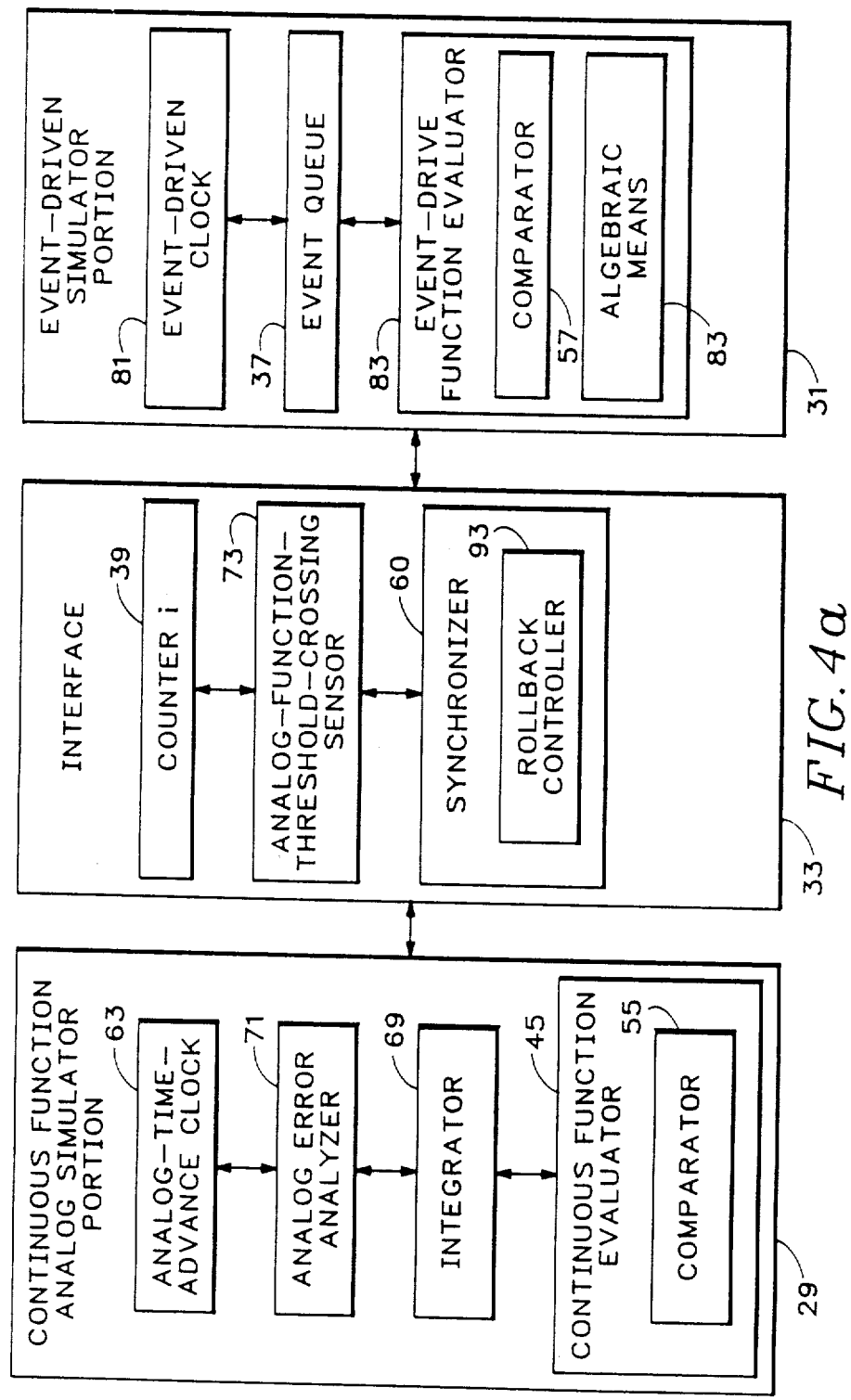
FIG. 4a is a block diagram of the components of the interface of the invention.

Turning now to FIGS. 4 and 4a, time steps in the analog realm are shown on line 30 while time steps in the event-driven realm are shown on line 32. Time advanced synchronization, as used herein, means that time when the simulator operating in one realm has something to tell the simulator operating in the other realm. In FIG. 4, assume that the analog simulator's next value is at time $t_1$ and the event-driven simulator's time value is at time $t_0$, and that the next event in the event queue is at $t_2$. Since it is known that the event-driven simulator cannot cause a change in analog models prior to $t_2$, the analog simulator now accepts the value at time $t_1$ and "peeks" at the future by selecting a time step and evaluating values at time $t_4$, assuming no changes in analog models between $t_1$ and $t_4$. The event-driven simulator now proceeds until time $t_3$, prior to $t_4$, with next time at time $t_5$. The situation now repeats, with the analog simulator accepting values at $t_4$ and peeking ahead to $t_7$. Should any threshold be crossed between $t_1$ and $t_4$, it is entered as an event in the event queue, but in the absence of analog model change due to event-driven realm changes, no synchronization is needed. However, if during event-driven simulation after $t_5$, a time $t_6$ is encountered when analog models are changed, the time $t_7$ is rolled back to $t_6$, the values of the analog simulator at $t_6$ are determined by polynomial interpolation on values at $t_7$, $t_6$, $t_1$ and possibly previous times, and the two time advances are synchronized. At this time, the analog simulator looks ahead again, possibly to a different time $t_8$, and the event-driven simulator may proceed. Thus, the simulator portions in the two realms are not lock stepped to one another, but are able to proceed independently until advised by the other portion of a value change or event which will affect values in the other portion.

Figure 5:
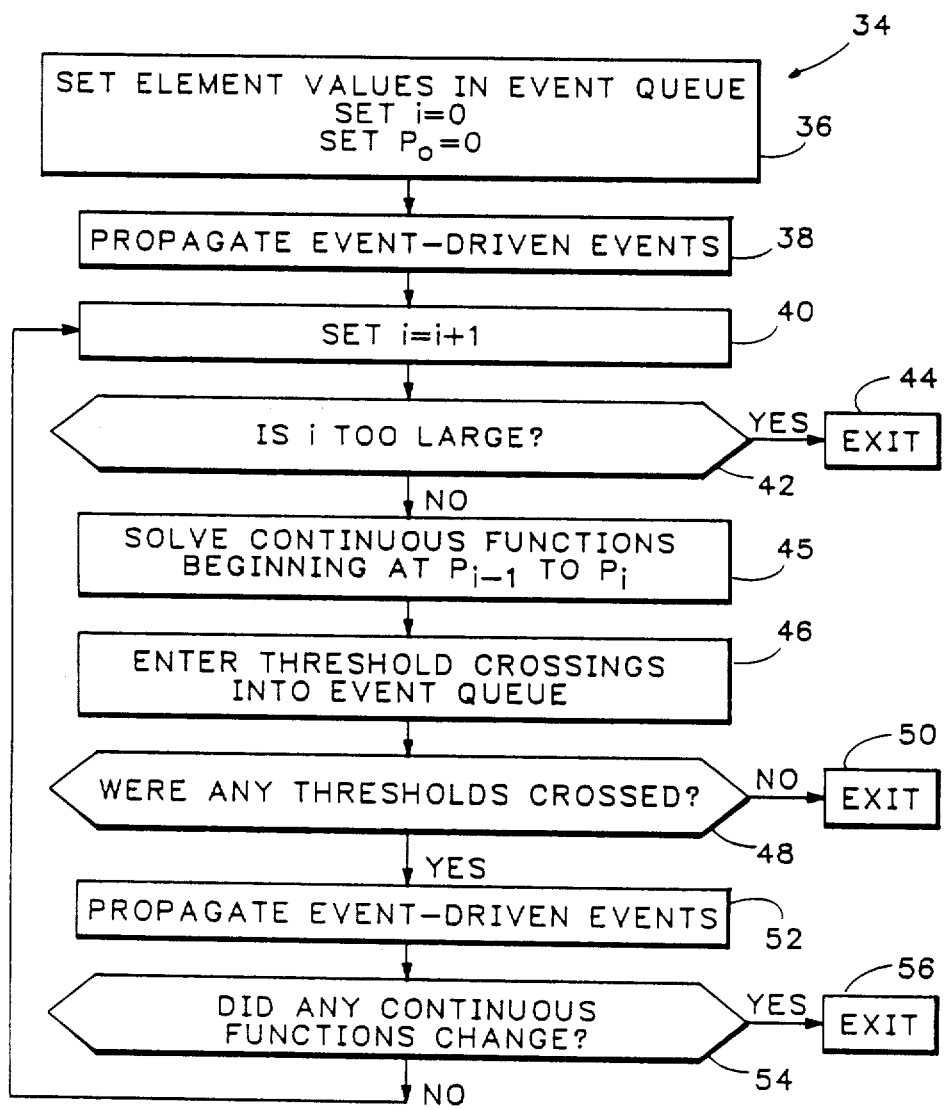
FIG. 5 is a block diagram representing an initialization phase of the interface.

Referring now to FIG. 5 and FIG. 4a, a block diagram representing an initialization phase, or initialization means, of the interface 33 is shown generally at 34. The first step, block 36 requires that the event-driven element internal and external values be entered into an event queue 37. A counter i 39 is set to zero as are the vector of all analog values $P_0$. Likewise, any elements which span the analog and event-driven realms have all their analog values set to zero.

The next step, block 38 requires that events in the event-driven realm are propagated using event-driven simulation.

The counter 39 is then moved by one unit, block 40, also referred to herein as means for advancing the counter, and examined, block 42, to see if the counter value is too large, i.e., has the simulation discovered a system without a DC steady state. If such progression has taken place, the simulator, is instructed to terminate initialization simulation, block 44. If the end of the simulation has not been reached, events in the analog realm are analyzed, by continuous function evaluation means 45, beginning at $P_l$ up to and including $P_i$, block 45, to evaluate continuous elements.

Once the analog variables are analyzed, (as if they were in a steady state) the threshold crossings between $P_{i-1}$ and $P_i$ are entered into the event queue 37, block 46. The event queue is examined to determine if any thresholds were crossed, block 48. If no thresholds were crossed, the initialization phase is terminated, block 50. If any thresholds were crossed, the event-driven simulator portion, or event-driven evaluation means 51, is instructed to propagate events in the event-driven realm, block 52, during the time advance.

If any of the continuous functions change as a result of changes in the event-driven realm, the procedure is looped back to block 40. If there are no changes in continuous functions at this point, the initialization phase is terminated, block 56.

Blocks 45, 48 and 54 represent comparison means 55, 57 which detect changes in one realm which occur as the result of changes in the other realm.

The method of operating the initialization phase may be summarized as including the steps of setting the initial event-driven external and internal values in an event queue, setting an event counter to i=0, and setting all continuous values to zero, block 36. Events in the event-driven realm are then propagated using event-driven simulation, block 38.

The counter 39 is then advanced by 1, block 40, and the simulator evaluated to determine if the end of the simulation has been reached, block 42. If the end of the simulation has been reached, the initialization phase is terminated, block 44.

If the end of the simulation has not been reached, the continuous functions are solved from i−1 to i, block 45, and any threshold crossing times are entered into the event queue, block 46. The output is examined for any threshold crossings, block 48, and, if no thresholds were crossed, the initialization phase is terminated, block 50.

If thresholds were crossed, the event-driven realm is examined and event-driven events propagated, block 52. Continuous events are again analyzed for changes as a result of changes in the event-driven realm, block 54. If no changes are detected in the analog realm, the initialization phase is terminated, block 56, otherwise, the initialization returns to block 40.

Figure 6A:
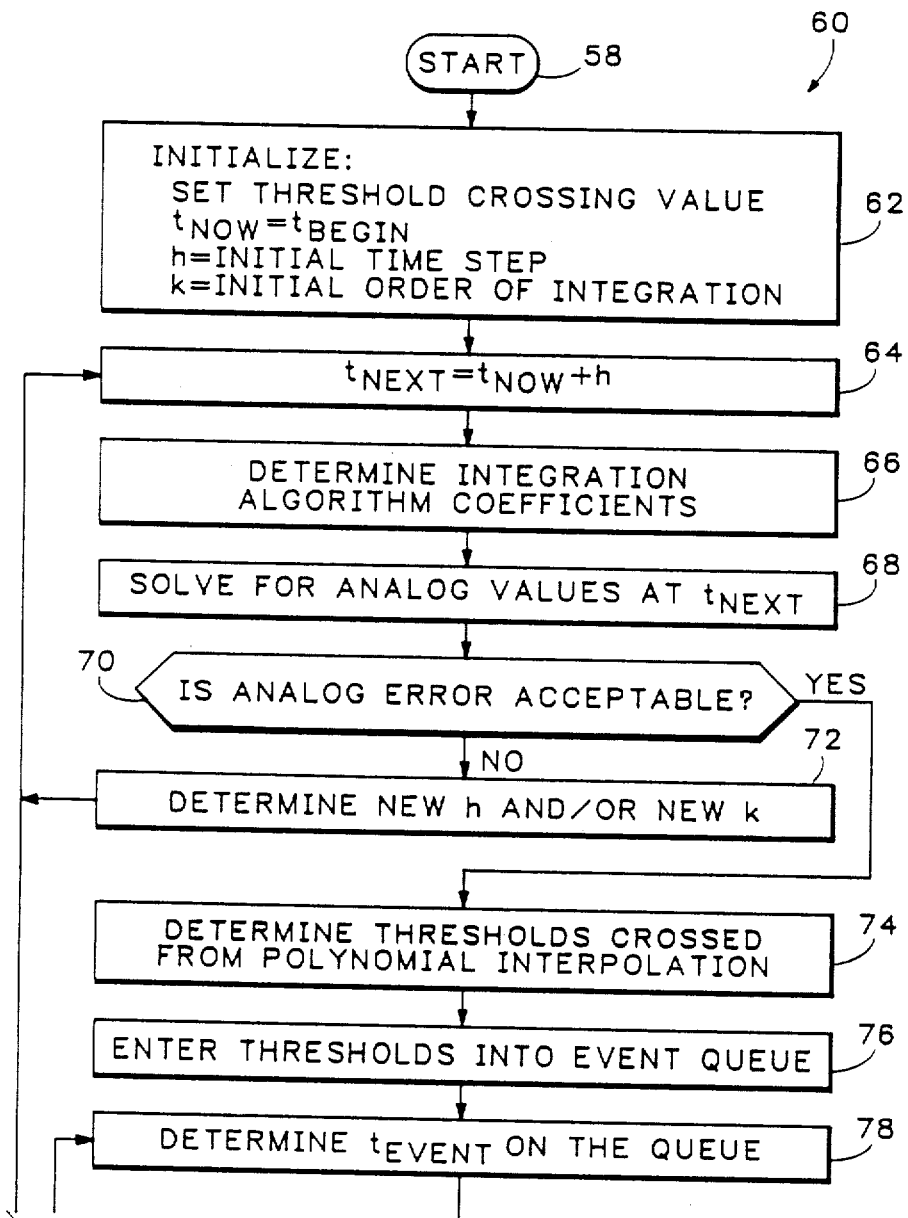
FIG. 6 is a block diagram representing a transient phase of the interface.
Figure 6B:
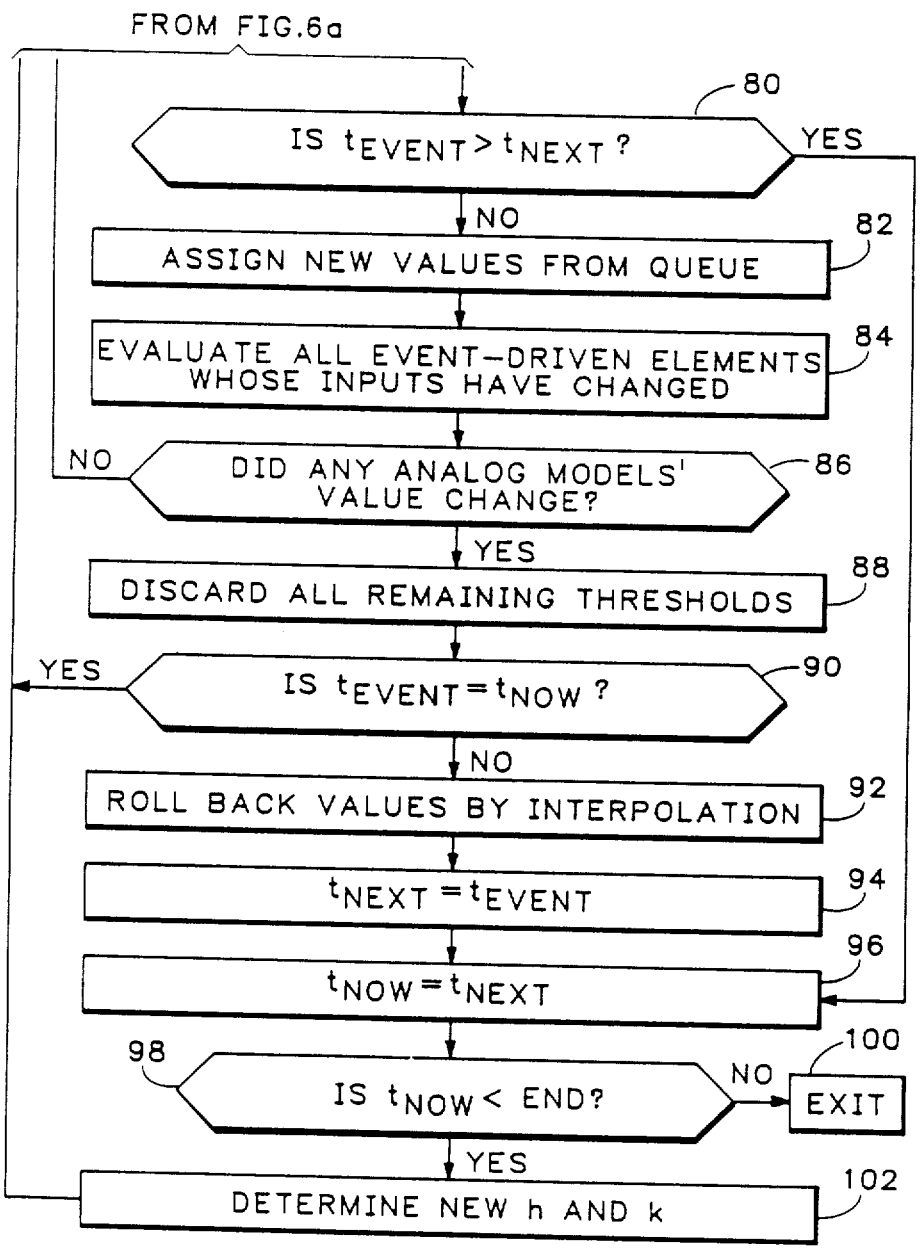

Depending on the purpose for running the initialization phase of the interface, the results at termination blocks 44, 50 and 56 may be an end result in themselves and the simulation need continue no further. However, if the transient phase is to be entered, the analog and event-driven values which are present at any of the termination blocks may be used to enter START block 58 of FIG. 6, in the transient phase, or transient analysis means, of the interface in the analog realm. The transient phase, or time advance synchronizer, depicted generally at 60, includes it own brief initialization procedures, represented in block 62. Initially, a threshold crossing value is selected, either by a user, or by an algorithm outside of the interface, $t_{now}$ is set equal to $t_{begin}$ and the initial time step h is determined. Additionally, the order of integration of continuous functions, k, is determined.

The next several steps analyze whether the proper values for h and k have been selected. First, $t_{next}$ is set equal to $t_{now}+h$, block 64, by analog time advance means, also referred to herein as means for advancing the analog simulator.

The integration algorithm coefficients are determined, block 66 and the integration algorithms are solved for analog values at $t_{next}$, block 68, in the integration means. The size of the analog error is examined by analog error analysis means 71 to determine if it is acceptable, block 70 and, if it is not, a new value for h and/or k is selected, block 72, and the procedure loops back to block 64 until such time as the integration algorithms are solved with an acceptable analog error. The components of blocks 64 and 70 comprise what is referred to herein as analog time advance means 63.

At this point, the analog, or continuous, function threshold crossing sensor 73, block 74 is antered, where all threshold crossings are determined and the time of their crossings are determined by interpolating polynomials of the same order as the integration algorithms on the newest $n_{k=1}$ previous analog values. These thresholds are then entered into the event queue 37, block 76. $T_{event}$ is next determined in the event queue, block 78. The time is examined to determine if $t_{event}$ is greater than $t_{next}$, block 80. If $t_{event}$ is less than or equal to $t_{next}$ the event-driven realm is entered. The values which were saved in the event queue are assigned in the event-driven realm by means for advancing the event-driven simulator 81, block 82. The next event time is also determined. All event-driven elements whose inputs were changed by the value assignment are evaluated by evaluation, or algebraic, means 83, block 84. The elements have an opportunity to schedule output changes of event-driven elements and change the analog behavior of digital-to-analog interface models.

The analog-realm simulator portion evaluates the analog models for any value change. If no value change occurred, the procedure loops back to block 78. An indication of a change in analog model values indicates that it is necessary for the interface to synchronize the analog 29 and event-driven 31 simulator portions. If such synchronization is necessary, the analog-realm simulator portion 29 must first discard all remaining, future thresholds, block 88. The analog simulator portion next determines whether $t_{event}$ is equal to $t_{now}$, block 90. Put another way, the simulator as a whole asks "Am I synchronized? ". If $t_{event}$ equals $t_{now}$, the system is synchronized and loops back to block 64. If the system is not synchronized, a synchronization is performed by rolling back continuous function values by polynomial interpolation by rollback means, block 92, of the same order k as the integration algorithms to an appropriate rollback time. Rollback means includes a polynomial interpolation rollback controller 93. The components represented by blocks 86 through 92 are referred to herein as synchronization means.

In block 94, $t_{next}$ is set equal to $t_{event}$ in order to reset the integration algorithm. The analog time is advanced by setting $t_{now}$ to $t_{now}+h$, or $t_{next}$, block 96. The interface then determines whether $t_{now}$ is less than the simulation end time, block 98. If $t_{now}$ is not less than the simulation end time, the simulation loop is terminated, block 100. If $t_{now}$ is in fact less than the simulation end time, a new integration order k and time step h are determined, block 102, and the transient phase simulation is run again.

Returning momentarily to block 80, in the event that $t_{event}$ is greater than $t_{next}$, the interface skips to the next analog advance time, block 96.

It should be remembered that the time advance in the analog realm is essentially error-driven as the analog-realm simulator attempts to minimize the errors in the integration algorithm while the event-driven realm is time advanced by those events in the analog realm, which are usually threshold crossings, and by all events in the event-driven realm.

The method of the invention may be briefly recapped as including, in an analog realm, determining a threshold crossing value for the continuous, or analog functions, determine the initial time step h, and determine the initial order of integration k, block 62. The continuous functions are integrated, block 68, and threshold crossing are detected with their crossing times, block 74.

In the digital realm, event-driven elements whose inputs have changed during the initial time step are evaluated, block 84. The continuous value functions are evaluated to determine if any of their values are changed as the results of events in the event-driven realm, block 86 If any of the continuous function values are changed, the continuous function output is rolled back in time by polynomial interpolation to a point before the continuous function was changed by the event-driven realm, block 92.

Figure 7:
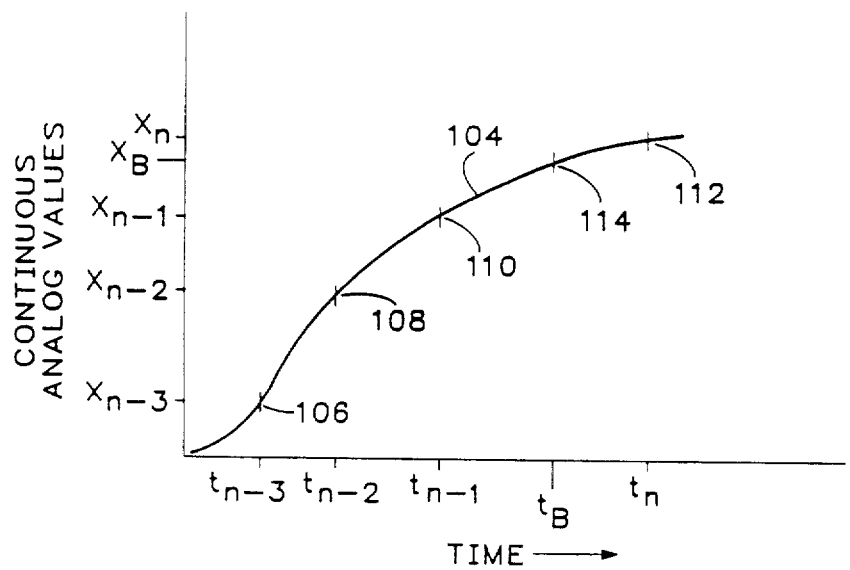
FIG. 7 is a graphical representation of a polynomial interpolation rollback.

Referring now to FIG. 7, an analog waveform 104, which may be a portion of waveform 24, is sampled at times $t_{n-i}$ with values $x_{n-i}$. The value $x_n$ at time $t_n$ is a future value obtained from the integration algorithm, assuming that there is no change in the analog-realm models in time between $t_{next}=t_n$ and $t_{now}=t_{n-1}$. Should an event occur in the event-driven realm which modifies an analog model, say at time $t_b$, it becomes necessary to synchronize the analog-realm simulator by returning to $t_b$. In order to make such a return, the analog-realm value, $x_b$ at $t_b$ must be found. Line 104 in FIG. 7, passing through points 106, 108, 110 and 112, represents a polynomial of the same order as the integration formula used to determine $x_n$, which, in this specific example, is an order of 3. $x_b$ is the value of this third order polynomial at time $t_b$ and is indicated by reference numeral 114 in FIG. 7. Time rollback, as used herein, means finding the value of a function at a time $t_b$ by polynomial interpolation on already-calculated points. This is distinguished from time backtrack, which would involve discarding the value x and then determining new values for $x_b'$ at $t_b$ from the integration formula, which is a much costlier process in terms of processor time and complexity.

Thus, a mixed-mode simulator interface has been described which synchronizes, as required, an analog simulator and an event-driven simulator, allowing the two simulators to proceed at their own paces, along their own time lines, but which provide that when events in one simulation realm effect events in the other simulation realm, that the simulators exchange data and correct any wrong assumptions which they have made in the course of their own operation.

Although a preferred embodiment of the invention has been disclosed herein, it should be appreciated that variations and modifications may be made thereto without departing from the scope of the invention as defined in the appended claims.

What I claim is:

1. A mixed-mode-simulator interface for synchronizing, at non-regular intervals, a system simulator which includes an analog simulator, which analyzes continuous-function elements and events at non-equal, error-determined intervals in an analog realm, and which has a predetermined threshold-crossing value therein, and an event-driven simulator, which analyzes elements and events at non-equal, event-driven intervals in an event-driven realm, wherein both simulators are performing a simulation on a single, mixed-mode system, comprising:

analog-time-advance means for advancing analog simulation time by a predetermined time amount;
   integration means for predicting analog values;
   analog-error-analysis means for determining an acceptable analog error and for selecting said predetermined time amount;
   an analog-function-threshold-crossing sensor for detecting, from the threshold-crossing value, a threshold crossing of a continuous function, and a crossing time therefore;
   an event queue for receiving said crossing time and event times and values from the event-driven simulator, and for determining a next-event time;
   evaluation means for evaluating only those event-driven elements whose value has changed since the last event; and
   synchronizer means for determining continuous function values at a future time which is prior to the end of said predetermined time amount.

2. The interface of claim 1 wherein said synchronizer means includes a polynomial-interpolation-rollback controller for examining continuous function elements at a future time prior to the end of said predetermined time amount.

3. The interface of claim 1 which further includes initialization means, including
   an event queue, which is operable to receive initial, preset external and internal values, and wherein all continuous values are initially set to zero;
   a counter i, which is initially set to zero;
   means for advancing said counter;

continuous function evaluation means for evaluating continuous elements and events during the advancing;

event-driven evaluation means for evaluating event-driven elements and events during the advancing; and comparison means in each of said continuous function evaluation means and said event-driven evaluation means for detecting changes in one realm as a result of changes in the other realm.

4. A mixed-mode-simulator interface for synchronizing, at non-regular intervals, a system simulator which includes an analog simulator, which analyzes continuous-function elements and events at non-equal, error-determined intervals in an analog realm, and which has a predetermined threshold-crossing value therein, and an event-driven simulator, which analyzes elements and events at non-equal, event-driven intervals in an event-driven realm, wherein both simulators are performing a simulation on a single, mixed-mode system, comprising:
   a time-advance synchronizer located between the analog and event-driven simulators which includes
   means for advancing the analog simulator by a time interval H of varying length;
   means for advancing the event-driven simulator by a varying-length time amount;
   integration means for determining continuous-function values during time interval h;
   algebraic means for determining event-driven values during the time amount;
   continuous-function examination means for determining events in the analog realm; and
   rollback means for evaluating interaction between the analog and digital realms and evaluating the continuous-function values at a time intermediate the beginning time B and a time B+h.

5. The interface of claim 4 wherein said rollback means includes a polynomial-interpolation-rollback controller for moving backwards in time along a continuous-function in the analog realm.

6. The interface of claim 4 which includes a continuous-function-threshold-crossing sensor for detecting, from the threshold-crossing value and said integration means, a threshold crossing, and a crossing time therefore.

7. The interface of claim 4 which further includes initialization means, including
   an event queue, which is operable to receive initial, preset external and internal values, and wherein all continuous values are initially set to zero;
   a counter i, which is initially set to zero;
   means for advancing said counter;
   continuous function evaluation means for evaluating continuous elements and events during the advancing;
   event-driven evaluation means for evaluating event-driven elements and events during the advancing; and
   comparison means in each of said continuous function evaluation means and said event-driven evaluation means for detecting changes in one realm as a result of changes in the other realm.

8. A mixed-mode-simulator interface for synchronizing, at non-regular intervals, a system simulator which includes an analog simulator, which analyzes continuous-function elements and events at non-equal, error-determined intervals in an analog realm having continuous functions, and which has a predetermined threshold-crossing value therein, and an event-driven simulator, which analyzes elements and events at non-equal, event-driven intervals in an event-driven realm, wherein both simulators are performing a simulation on a single, mixed-mode system, comprising:
   initialization means, including
      an event queue, which is operable to receive initial, preset external and internal values, and wherein all continuous values are initially set to zero;
      a counter i, which is initially set to zero;
      means for advancing said counter;
      continuous function evaluation means for evaluating continuous elements and events during the advancing;
      event-driven evaluation means for evaluating event-driven elements and events during the advancing; and
      comparison means in each of said continuous function evaluation means and said event-driven evaluation means for detecting changes in one realm as a result of changes in the other realm;
   transient analysis means, including
      analog-time-advance means for advancing analog simulation time by a predetermined time amount;
      integration means for predicting analog values;
      analog-error-analysis means for determining an acceptable analog error and for selecting said predetermined time amount;
      an analog-function-threshold-crossing sensor for detecting, from the threshold-crossing value, a threshold crossing, and a crossing time therefore;
      an event queue for receiving said crossing time and event times and values from the event-driven simulator, and for determining a next-event time;
      evaluation means for evaluating only those event-driven elements whose value has changed since the last event; and
      synchronizer means including a polynominal-interpolation-rollback controller for examining continuous elements at a future time prior to the end of said predetermined time amount.

9. A method of synchronizing an analog simulator, operating in an analog realm, and an event-driven simulator, operating in an event-driven realm, wherein both simulators are performing a simulation of a mixed-mode system, comprising:
   in the analog realm:
      determining a threshold-crossing value for continuous functions;
      determining an initial time step h;
      determining an initial order of integration of continuous functions;
      integrating the continuous functions
      detecting, from the threshold-crossing value and the integration of a continuous function, the crossing time of continuous functions;
   in the digital realm:
      evaluating event-driven elements whose inputs were changed during the initial time step;
   in the analog realm:
      evaluating any changes in continuous function values which occurred as a result of the changed event-driven elements; and
      If any continuous function values were changed as a result of changed event-driven elements, rolling back, by polynomial interpolation, in time along the continuous function.

10. The method of claim 9 which includes, prior to said determining of a threshold-crossing value, initializing the simulator, said initializing including the steps of:
- setting initial event-driven external and internal values in an event queue;
- setting an event counter $i=0$;
- setting all continuous values to zero;
- propagating events, in the event-driven realm, using event-driven simulation;
- integrate continuous functions from $i-1$ to $i$;
- detect threshold crossings between $i-1$ and $i$, and enter crossing times into event queue;
- further propagating events in the event driven realm; and
- analyzing continuous function for changes as a result of changes in the event-driven realm.

* * * * *

UNITED STATES PATENT AND TRADEMARK OFFICE
CERTIFICATE OF CORRECTION

PATENT NO. : 4,985,860
DATED : January 15, 1991
INVENTOR(S) : Martin Vlach

It is certified that error appears in the above-identified patent and that said Letters Patent is hereby corrected as shown below:

In column 2, line 16 after "problem" insert --,--; lines 29-30 replace "$x_{n-1}, x_{n-2} \ldots X_{n-k}$ and $\dot{x}_{n-1}, \dot{x}_{n-2} \ldots \dot{x}_{n-k}$," with --$x_{n-1}, x_{n-2} \ldots x_{n-k}$ and $\dot{x}_{n-1}, \dot{x}_{n-2} \ldots \dot{x}_{n-k}$,--.

In column 3, line 16 replace "turnon" with --turn-on--.

In column 4, line 18 replace "$g(x_n) = r(x_{n-i}, x_{n-i}, t_n)$" with --$g(x_n) = r(x_{n-i}, \dot{x}_{n-i}, t_n)$--.

In column 6, line 48 after "realm" insert --29 Fig. 4<u>a</u>)--; line 49 after "realm" insert --31--.

In column 7, line 35 replace "$P_i$" with --$P_{i-1}$--.

In column 8, line 32 after "means" insert --or clock, 63--; line 37 after "means" insert --69--; line 46 replace "antered" with --entered--; line 50 replace "$n_{k=1}$" with --$n_{k+1}$--.

In column 9, line 8 after "synchronized?" delete the space.

In column 10, line 8 replace "x" with --$x_n$--.

Signed and Sealed this

Eighteenth Day of August, 1992

*Attest:*

DOUGLAS B. COMER

*Attesting Officer*  *Acting Commissioner of Patents and Trademarks*